United States Patent
Toya et al.

(10) Patent No.: US 10,608,580 B2
(45) Date of Patent: Mar. 31, 2020

(54) CONCENTRATOR PHOTOVOLTAIC UNIT, CONCENTRATOR PHOTOVOLTAIC MODULE, CONCENTRATOR PHOTOVOLTAIC PANEL, AND CONCENTRATOR PHOTOVOLTAIC APPARATUS

(71) Applicant: Sumitomo Electric Industries, Ltd., Osaka-shi (JP)

(72) Inventors: Kazumasa Toya, Osaka (JP); Takashi Iwasaki, Osaka (JP); Youichi Nagai, Osaka (JP); Yoshiya Abiko, Osaka (JP); Kenji Saito, Osaka (JP); Makoto Inagaki, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 321 days.

(21) Appl. No.: 14/912,775

(22) PCT Filed: Aug. 12, 2014

(86) PCT No.: PCT/JP2014/071306
§ 371 (c)(1),
(2) Date: Feb. 18, 2016

(87) PCT Pub. No.: WO2015/064178
PCT Pub. Date: May 7, 2015

(65) Prior Publication Data
US 2016/0204736 A1    Jul. 14, 2016

(30) Foreign Application Priority Data

Oct. 31, 2013   (JP) ................................. 2013-227181

(51) Int. Cl.
*H02S 40/22*        (2014.01)
*H02S 20/32*        (2014.01)
(Continued)

(52) U.S. Cl.
CPC .......... *H02S 40/22* (2014.12); *G02B 19/0014* (2013.01); *G02B 19/0042* (2013.01);
(Continued)

(58) Field of Classification Search
CPC .......... H02S 20/30; H02S 20/32; H02S 40/20; H02S 40/22; Y02E 10/52; H01L 31/2322;
(Continued)

(56) References Cited

U.S. PATENT DOCUMENTS 4,592,129 A * 6/1986 Legge .................... G02B 1/115
                                                      136/256
5,175,783 A    12/1992 Tatoh
(Continued)

FOREIGN PATENT DOCUMENTS

CN    101523242 A    9/2009
JP    60-063969 A    4/1985
(Continued)

OTHER PUBLICATIONS

International Search Report in International Application No. PCT/JP2014/071306, dated Nov. 25, 2014.

*Primary Examiner* — Lindsey A Bernier
(74) *Attorney, Agent, or Firm* — Baker Botts L.L.P.; Michael A. Sartori

(57) ABSTRACT

In a concentrator photovoltaic unit configured to guide sunlight concentrated by a primary concentrating portion to a power generating element by means of a secondary concentrating portion, the secondary concentrating portion includes: a secondary lens having a three-dimensional shape; and a cover portion being translucent and having a refractive index higher than that of air and lower than that of the secondary lens, the cover portion covering at least a surface on which the sunlight is incident in a surface of the secondary lens, in a thin film shape extending along the (Continued)

surface on which the sunlight is incident. By arranging a large number of the units, a concentrator photovoltaic module can be configured. By arranging a large number of the concentrator photovoltaic modules, a concentrator photovoltaic panel can be configured. By further providing a driving device for tracking the sun, a concentrator photovoltaic apparatus can be configured.

5 Claims, 13 Drawing Sheets

(51) Int. Cl.
  *H01L 31/054* (2014.01)
  *G02B 19/00* (2006.01)
  *H01L 31/0232* (2014.01)
(52) U.S. Cl.
  CPC ...... *H01L 31/0232* (2013.01); *H01L 31/0543* (2014.12); *H02S 20/32* (2014.12); *Y02E 10/52* (2013.01)
(58) Field of Classification Search
  CPC ............... H01L 31/054; H01L 31/0543; H01L 31/0232
  See application file for complete search history.

(56) References Cited

U.S. PATENT DOCUMENTS

| | | |
|---|---|---|
| 2009/0191406 A1 | 7/2009 | Yoneda et al. |
| 2010/0065862 A1* | 3/2010 | Ray ........................ B82Y 20/00 257/88 |
| 2010/0236603 A1 | 9/2010 | Menard et al. |
| 2010/0326494 A1* | 12/2010 | Okamoto ................ F24J 2/085 136/246 |
| 2011/0108113 A1* | 5/2011 | Arikawa ............... H01L 31/048 136/259 |
| 2013/0146120 A1* | 6/2013 | Seel .................... H01L 31/0524 136/246 |
| 2014/0090692 A1* | 4/2014 | Okamoto ............. H01L 31/048 136/246 |

FOREIGN PATENT DOCUMENTS

| | | | |
|---|---|---|---|
| JP | 03-288480 A | 12/1991 | |
| JP | 2002-270885 A | 9/2002 | |
| JP | 2013-077705 A | 4/2013 | |
| JP | 2013-149831 A | 8/2013 | |
| WO | WO-2012160994 A1 * | 11/2012 | ........... H01L 31/048 |
| WO | WO-2013/147008 A1 | 3/2013 | |

* cited by examiner (a)

(b)

CONCENTRATOR PHOTOVOLTAIC UNIT, CONCENTRATOR PHOTOVOLTAIC MODULE, CONCENTRATOR PHOTOVOLTAIC PANEL, AND CONCENTRATOR PHOTOVOLTAIC APPARATUS

TECHNICAL FIELD

The present invention relates to a unit, a module, a panel, and an apparatus for concentrator photovoltaic (CPV) for generating power by concentrating sunlight on a power generating element.

BACKGROUND ART

A unit that forms an optical system base unit for concentrator photovoltaic includes, for example, a primary lens being a convex lens, a secondary lens being a sphere lens, and a power generating element (for example, see PATENT LITERATURE 1 (FIG. 8)). As the power generating element, a solar cell having high power generation efficiency is used. Sunlight is concentrated by the primary lens, to be incident on the secondary lens, and then is further concentrated by the secondary lens, to reach the power generating element. Such a configuration allows much light energy to be concentrated onto a small power generating element, whereby power can be generated with high efficiency. A large number of such concentrator photovoltaic units are arranged in a matrix shape to form a concentrator photovoltaic module, and then, a large number of the modules are arranged in a matrix shape to form a concentrator photovoltaic panel. The concentrator photovoltaic panel forms a concentrator photovoltaic apparatus, together with a driving device for causing the panel to perform tracking operation while facing the sun.

The secondary lens is provided in order to concentrate light energy onto a small area, thereby reducing the area necessary for the expensive power generating element as much as possible, but rather, in order to reduce deviation in tracking the sun and reduce influence of an error in the mounting position of the secondary lens relative to the primary lens, thereby increasing concentrating accuracy. That is, in the case of the primary lens alone, when the optical axis is displaced due to tracking deviation or an error in the mounting position, a part of the concentrated light goes outside the light receiving surface of the power generating element. In this case, power generation efficiency is reduced. Thus, in order to guide light to the power generating element even if some displacement of the optical axis has occurred, the secondary lens being a sphere lens is provided (for example, see PATENT LITERATURE 1 (FIG. 10c)).

There has also been proposed a technology in which, as a secondary lens, a lens having a special shape including two arc-like protrusions is used to increase power generation efficiency (for example, see PATENT LITERATURE 2 (FIG. 6, paragraph [0006])). Also in this case, light that would go outside the light receiving surface of the power generating element with a primary lens alone can be guided to the light receiving surface by the secondary lens.

CITATION LIST

Patent Literature

[PATENT LITERATURE 1] US Patent Application Publication US2010/0236603 A1

[PATENT LITERATURE 2] Japanese Laid-Open Patent Publication No. 2002-270885

SUMMARY OF INVENTION

Technical Problem

However, in a concentrator photovoltaic unit including a secondary lens in addition to a primary lens, transmittance of light is not 100% in both of the primary lens and the secondary lens. The reason that the transmittance is not 100% is reflection and absorption of light by each lens. In order to generate power with higher efficiency, it is desired to increase transmittance of light as much as possible. Actually, however, even increasing by 1% is not easy.

In view of the conventional problem, an object of the present invention is to increase, in an optical system for concentrator photovoltaic including a secondary lens, the amount of light that reaches a power generating element, thereby to improve power generation efficiency.

Solution to Problem

The present invention is a concentrator photovoltaic unit configured to guide sunlight concentrated by a primary concentrating portion to a power generating element by means of a secondary concentrating portion, the secondary concentrating portion including: a secondary lens having a three-dimensional shape; and a cover portion being translucent and having a refractive index higher than that of air and lower than that of the secondary lens, the cover portion covering at least a surface on which the sunlight is incident in a surface of the secondary lens, in a thin film shape extending along the surface on which the sunlight is incident.

In addition, with the concentrator photovoltaic unit, it is possible to configure a concentrator photovoltaic module/panel/apparatus.

Advantageous Effects of Invention

According to the concentrator photovoltaic unit of the present invention, power generation efficiency can be improved. The same also applies to a concentrator photovoltaic module/panel/apparatus including the unit.

BRIEF DESCRIPTION OF DRAWINGS

FIG. 2 shows one example of a concentrator photovoltaic system including a driving device and the like.

DESCRIPTION OF EMBODIMENTS

Summary of Embodiments

Figure 1:
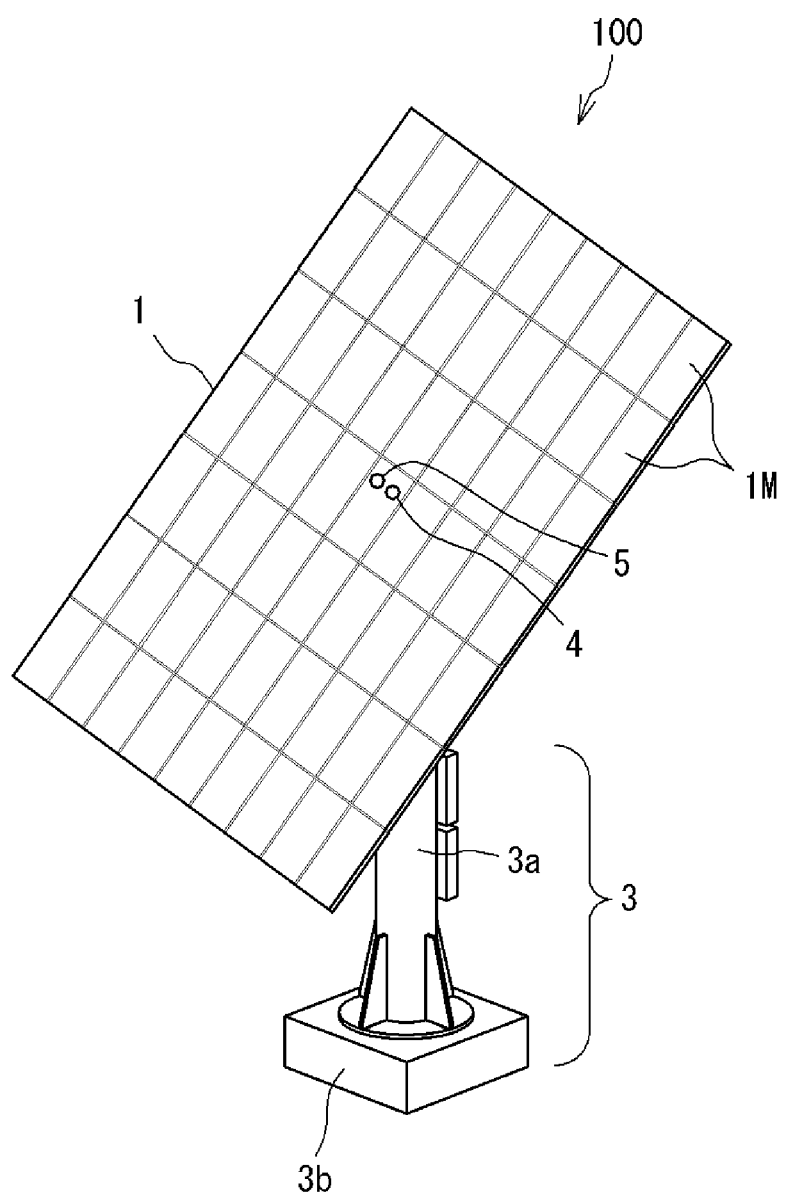
FIG. 1 is a perspective view showing one example of a concentrator photovoltaic apparatus.

Summary of embodiments of the present invention includes at least the following.

(1) This concentrator photovoltaic unit is a concentrator photovoltaic unit configured to guide sunlight concentrated by a primary concentrating portion to a power generating element by means of a secondary concentrating portion, the secondary concentrating portion including: a secondary lens having a three-dimensional shape; and a cover portion being translucent and having a refractive index higher than that of air and lower than that of the secondary lens, the cover portion covering at least a surface on which the sunlight is incident in a surface of the secondary lens, in a thin film shape extending along the surface on which the sunlight is incident.

In the concentrator photovoltaic unit configured as above, the cover portion exhibits a function of AR (Anti-Reflection) coating which suppresses reflection of light to be incident on the secondary lens. Therefore, reflection of light is suppressed, and the amount of light to be incident on the secondary lens and the amount of light to be guided to the power generating element are increased. Thus, power generation efficiency of the concentrator photovoltaic unit can be improved. Since the cover portion is in the thin film shape (not greater than 0.2 mm, for example), absorption (loss) of light by the cover portion itself can be suppressed.

(2) In (1), the cover portion may be a part of a resin molded body enveloping the secondary lens so as to be enclosed therein.

In this case, the secondary lens and the cover portion can be integrally formed by the resin molded body. Accordingly, a stable quality of the secondary concentrating portion can be obtained. Even in the case of the secondary lens having a three-dimensional shape and thus being not easy to be positioned and retained, the secondary lens can be accurately positioned on the substrate on which the power generating element is mounted, and at the same time, can be fixed easily and reliably. As the resin, silicone resin or acrylic resin can be used, for example.

(3) In (2), the resin molded body may be a molded body including the power generating element in addition to the secondary lens.

In this case, the optical system from the secondary concentrating portion to the power generating element can be integrally formed by the resin molded body. Accordingly, a stable quality of the optical system can be obtained.

(4) In any of (1) to (3), preferably, a shape of the secondary lens includes, at least in a part thereof, one or more of a spherical surface, an ellipsoid surface, a circular cone surface, and an inverted truncated pyramid surface.

Such a shape does not cause great reduction of the amount of light to be guided to the power generating element, even when the optical axis of the secondary lens is slightly displaced from the optical axis of the primary concentrating portion.

(5) In any of (1) to (4), for example, relative to incident light having a wavelength of 300 nm to 2000 nm, a refractive index of the secondary lens is 1.49 to 1.56, and the refractive index of the cover portion is 1.39 to 1.45.

In this case, for light having wavelengths from ultraviolet light to infrared light included in sunlight, preferable refractive indices can be set.

(6) The concentrator photovoltaic unit of (1) may include a bottom surface of the concentrator photovoltaic unit; a substrate provided on the bottom surface, the substrate having the power generating element placed thereon; and a package retaining the power generating element on the substrate, wherein a resin molded body including the cover portion continuously covers the surface of the secondary lens, the power generating element, the package, the substrate, and the bottom surface.

In this case, the resin molded body forms the cover portion, and fixes portions being in contact with the resin molded body to each other. Accordingly, integration is enhanced in each of between the secondary lens and the package, between the package and the substrate, and between the substrate and the bottom surface, and mutual bonding strength can be increased.

(7) In (6), the resin molded body may have an insulating property; and a site where the secondary lens and the package are in contact with each other, and a site where the package and the substrate are in contact with each other may be covered with the resin molded body, in all azimuths without any gap.

In this case, the power generating element is insulated by the resin molded body, and withstanding voltage performance of the conducting portion of the power generating element is enhanced. Moreover, even in a high temperature and high humidity environment, moisture does not enter the conducting portion, and thus, the concentrator photovoltaic unit which is highly reliable can be realized.

(8) In (6) and (7), the resin molded body may be made of a translucent resin in an entirety thereof.

In this case, a part of the resin molded body serves as the cover portion that is translucent, and the resin molded body also serves as a fixing member which mutually fixes the secondary lens and the like. Therefore, covering of the secondary lens and fixation of the vicinity thereof can be provided at the same time, and thus, the production process can be shortened.

(9) A concentrator photovoltaic module formed by arranging a plurality of the concentrator photovoltaic units of (1) can be provided.

In this case, the amount of light to be guided to the power generating element is increased in the entirety of the module. Thus, power generation efficiency of the concentrator photovoltaic module can be improved.

(10) A concentrator photovoltaic panel formed by arranging a plurality of the concentrator photovoltaic modules of (9) can be provided.

In this case, the amount of light to be guided to the power generating element is increased in the entirety of the panel. Thus, power generation efficiency of the concentrator photovoltaic panel can be improved.

(11) A concentrator photovoltaic apparatus including: the concentrator photovoltaic panel of (10); and a driving device configured to drive the concentrator photovoltaic panel so as to perform operation of tracking movement of the sun while facing a direction of the sun can be provided.

In this case, it is possible to provide a concentrator photovoltaic apparatus which maintains, always during daytime, a state of the highest power generation efficiency at that time point.

Details of Embodiments

<<Concentrator Photovoltaic Apparatus/Concentrator Photovoltaic Panel>>

Hereinafter, details of embodiments of the present invention will be described with reference to the drawings. First, a structure of a concentrator photovoltaic apparatus will be described.

FIG. 1 is a perspective view showing one example of a concentrator photovoltaic apparatus. In the drawing, a concentrator photovoltaic apparatus 100 includes a concentrator photovoltaic panel 1, and a pedestal 3 which includes a post 3a and a base 3b thereof, the post 3a supporting the concentrator photovoltaic panel 1 on the rear surface thereof. The concentrator photovoltaic panel 1 is formed by assembling multiple concentrator photovoltaic modules 1M vertically and horizontally. In this example, 62 (7 in length×9 in breadth−1) concentrator photovoltaic modules 1M are assembled vertically and horizontally, except the center portion. When one concentrator photovoltaic module 1M has a rated output of, for example, about 100 W, the entirety of the concentrator photovoltaic panel 1 has a rated output of about 6 kW.

On the rear surface side of the concentrator photovoltaic panel 1, a driving device (not shown) is provided, and by operating the driving device, it is possible to drive the concentrator photovoltaic panel 1 in two axes of the azimuth and the elevation. Accordingly, the concentrator photovoltaic panel 1 is driven so as to always face the direction of the sun in both of the azimuth and the elevation. At a place (in this example, the center portion) on the concentrator photovoltaic panel 1, or in the vicinity of the panel 1, a tracking sensor 4 and a pyrheliometer 5 are provided. Operation of tracking the sun is performed, relying on the tracking sensor 4 and the position of the sun calculated from the time, the latitude, and the longitude of the installation place.

That is, every time the sun has moved by a predetermined angle, the driving device drives the concentrator photovoltaic panel 1 by the predetermined angle. The event that the sun has moved by the predetermined angle may be determined by the tracking sensor 4, or may be determined by the latitude, the longitude, and the time. Thus, there are also cases that the tracking sensor 4 is omitted. The predetermined angle is, for example, a constant value, but the value may be changed in accordance with the altitude of the sun and the time.

Figure 2:
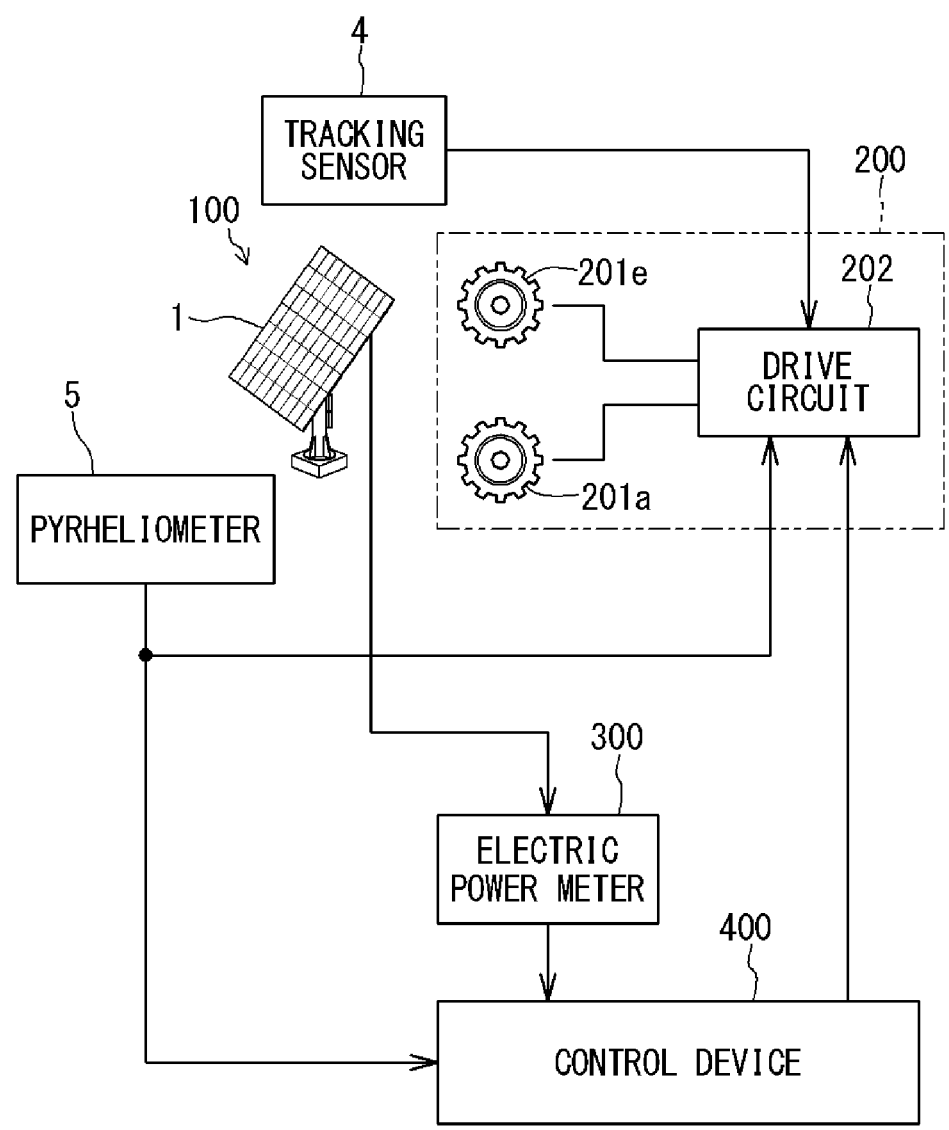

FIG. 2 shows one example of a concentrator photovoltaic system including the driving device and the like. This figure is expressed from the viewpoint of tracking operation control. In FIG. 2, as described above, the concentrator photovoltaic apparatus 100 includes a driving device 200 for operation of tracking the sun, on the rear surface side thereof, for example. The driving device 200 includes a stepping motor 201e for driving into the elevation direction, a stepping motor 201a for driving into the azimuth direction, and a drive circuit 202 which drives these. It should be noted that the stepping motors are merely examples, and another power source may be used.

An output signal (direct solar irradiance) from the pyrheliometer 5 is inputted to the drive circuit 202 and a control device 400. Generated power of the concentrator photovoltaic panel 1 can be sensed by an electric power meter 300, and a signal indicating the sensed electric power is inputted to the control device 400. The driving device 200 stores the latitude and the longitude of the installation place of the concentrator photovoltaic panel 1, and also has a function of a clock. Based on an output signal from the tracking sensor 4 and the position of the sun calculated from the latitude, the longitude, and the time, the driving device 200 causes tracking operation to be performed such that the concentrator photovoltaic panel 1 always faces the sun. However, as described above, there are cases where the tracking sensor 4 is not provided. In such a case, tracking operation is performed based on only the position of the sun calculated from the latitude, the longitude, and the time.

<<Concentrator Photovoltaic Module>>

Figure 3:
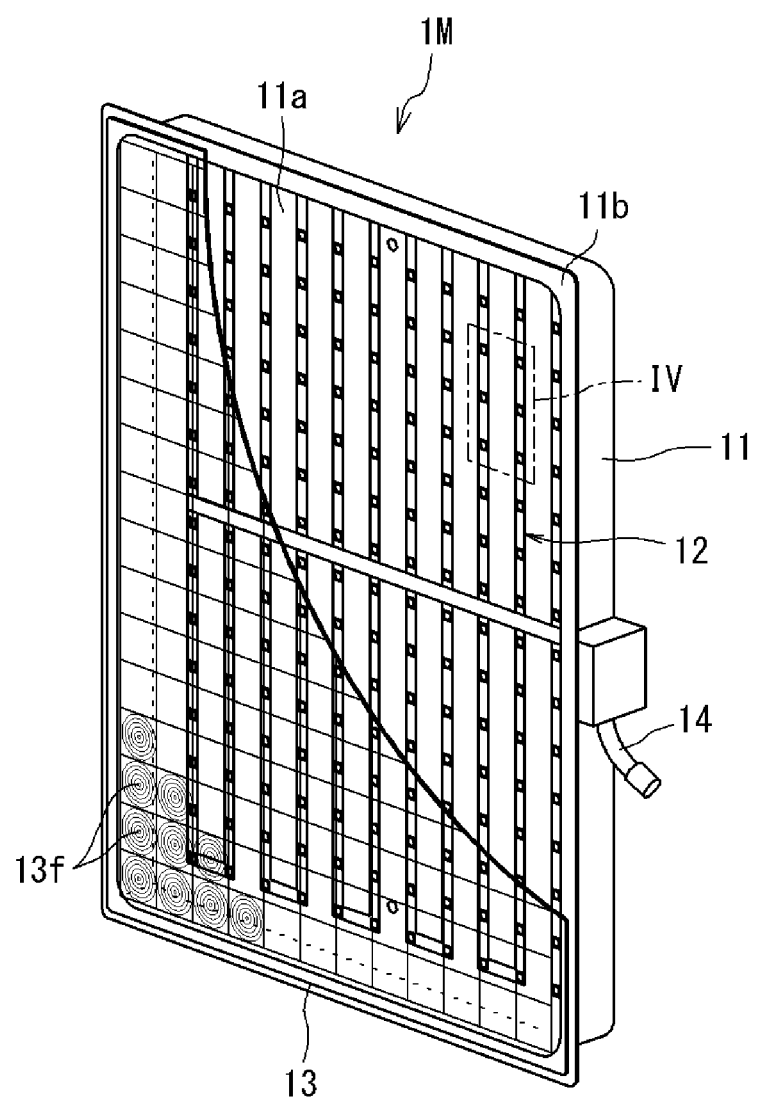
FIG. 3 is a perspective view (partially cut out) showing an enlarged view of one example of a concentrator photovoltaic module.

FIG. 3 is a perspective view (partially cut out) showing an enlarged view of one example of a concentrator photovoltaic module (hereinafter, also simply referred to as module) 1M. In the drawing, the module 1M includes as main components: a housing 11 formed in a vessel shape (vat shape) and having a bottom surface 11a; a flexible printed circuit 12 provided in contact with the bottom surface 11a; and a primary concentrating portion 13 attached, like a cover, to a flange portion 11b of the housing 11. The housing 11 is made of metal.

The primary concentrating portion 13 is a Fresnel lens array and is formed by arranging, in a matrix shape, a plurality of (for example, 16 in length×12 in breadth, 192) Fresnel lenses 13f which concentrate sunlight. The primary concentrating portion 13 can be obtained by, for example, forming a silicone resin film on a back surface (inside) of a glass plate used as a base material. Each Fresnel lens is formed on this resin film. On the external surface of the housing 11, a connector 14 for taking out an output from the module 1M is provided.

Figure 4:
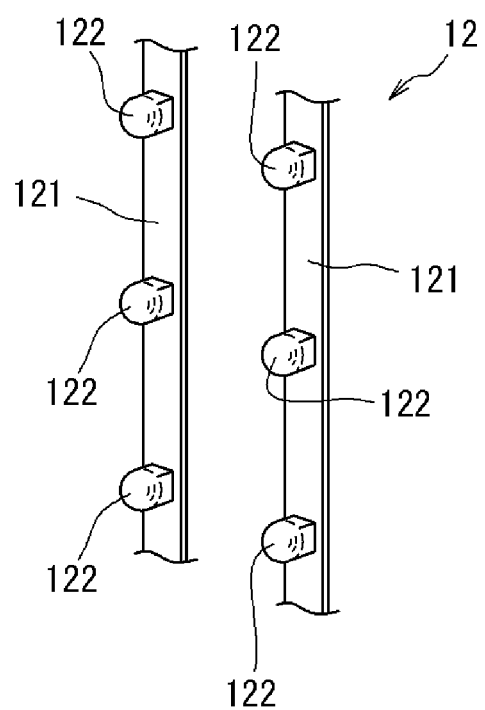
FIG. 4 is an enlarged view of a IV portion in FIG. 3.

FIG. 4 is an enlarged view of a IV portion in FIG. 3. In FIG. 4, the flexible printed circuit 12 includes a flexible substrate 121 having a ribbon shape, and secondary concentrating portions 122 thereon. The secondary concentrating portions 122 are provided at positions corresponding to the Fresnel lenses 13f of the primary concentrating portion 13, by the same number of the Fresnel lenses 13f.

It should be noted that the flexible substrate 121 used as the substrate is merely one example, and a substrate of another kind can be used. For example, multiple resin substrates or multiple ceramic substrates having a flat plate shape (rectangular shape or the like) may be used.

Figure 5:
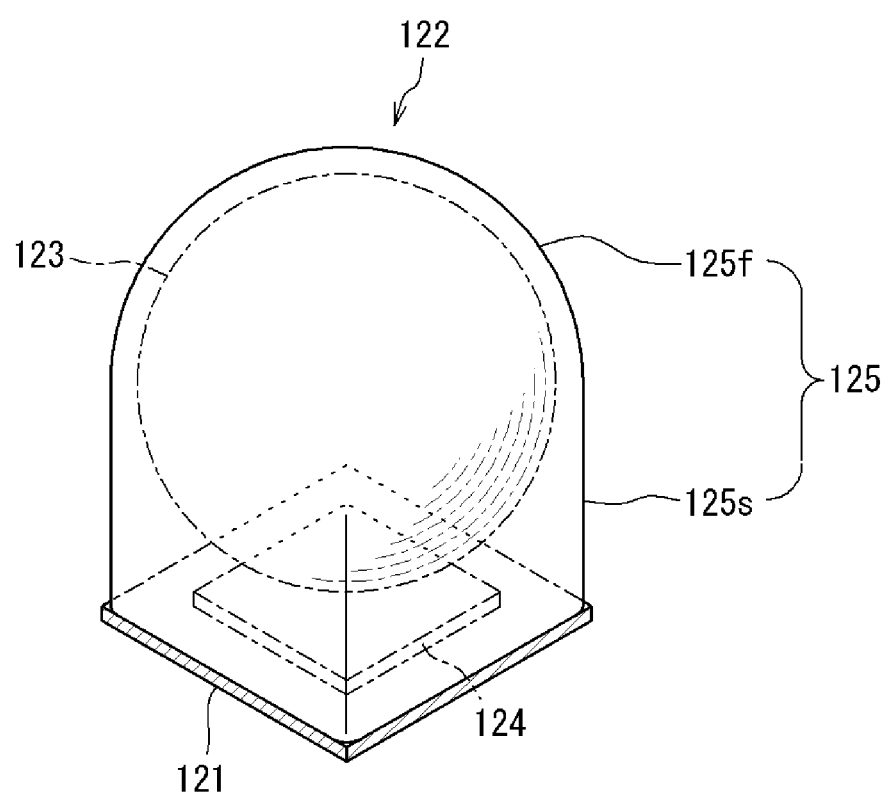
FIG. 5 is a perspective view showing an enlarged view of a secondary concentrating portion together with a flexible substrate and a power generating element.

FIG. 5 is a perspective view showing an enlarged view of the secondary concentrating portion 122 together with the flexible substrate 121 and a power generating element 124. In the drawing, the secondary concentrating portion 122 is composed of a resin molded body 125 on the outside and a secondary lens 123 enveloped so as to be enclosed in the resin molded body 125. Beneath the secondary concentrating portion 122, the power generating element 124 is present, and the power generating element 124 is mounted on the flexible substrate 121. Actually, the power generating element 124 includes a lead frame being an electrode portion for taking out an output therefrom, but here, the lead frame is omitted in order to simplify the drawing. The power generating elements 124 in the module 1M are electrically connected in series-parallel via a conducting pattern provided on the flexible substrate 121, whereby a desired generated power can be obtained as the entirety of the module 1M.

Figure 6:
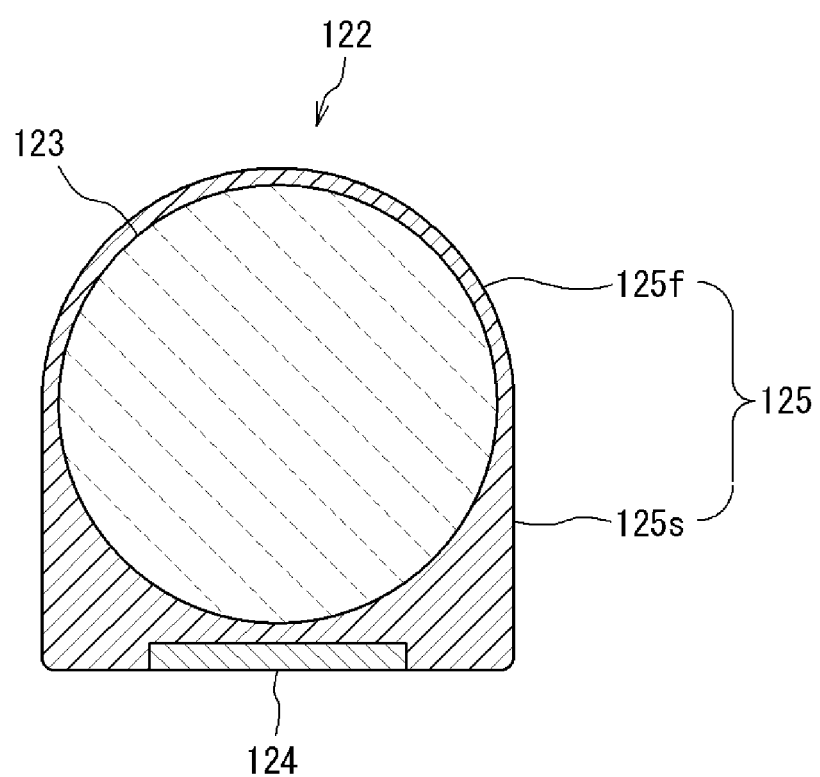
FIG. 6 is a cross-sectional view showing only the secondary concentrating portion and the power generating element.

FIG. 6 is a cross-sectional view showing only the secondary concentrating portion 122 and the power generating element 124. The secondary lens 123 shown as an example in FIG. 5 and FIG. 6 is spherical, and is made of borosilicate-based or quartz-based glass. The resin molded body 125 can be manufactured by molding the secondary lens 123 with silicone resin or acrylic resin, for example. The resin molded body 125 has translucency. The resin molded body 125 includes: a cover portion 125*f* having a dome shape and covering the upper hemisphere of the secondary lens 123; and a support portion 125*s* supporting the secondary lens 123. The cover portion 125*f* substantially covers the upper hemisphere of the secondary lens 123. That is, the cover portion 125*f* covers, of the surface of the secondary lens 123, a surface on which sunlight is incident, in a thin film shape extending along the surface on which sunlight is incident. In FIG. 6, for the convenience of drawing, the cover portion 125*f* is drawn rather thick, but the cover portion 125*f* has a thickness of not greater than 0.2 mm, for example. Moreover, between the secondary lens 123 and the power generating element 124, there is a gap in which resin is introduced to be present therein. Thus, the secondary lens 123 is not directly on the power generating element 124.

Here, relative to the refractive index of air being 1.0, the refractive indices of the secondary lens 123 and the cover portion 125*f* are as follows. This numerical value range sets preferable refractive indices for light having wavelengths from ultraviolet light (wavelength 300 nm) to infrared light (wavelength 2000 nm) included in sunlight.

Secondary lens: 1.49 to 1.56
Cover portion: 1.39 to 1.45

Thus, a relationship is established that the refractive index of the cover portion 125*f* is higher than that of air, and lower than that of the secondary lens 123. Due to this relationship and the cover portion 125*f* being in a thin film shape, reflection of light to be incident on the secondary lens 123 can be suppressed.

As shown, since the resin molded body 125 envelops the secondary lens 123 so as to be enclosed therein, the secondary lens 123 and the cover portion 125*f* can be integrally formed by the resin molded body 125. Accordingly, a stable quality of the secondary concentrating portion 122 can be obtained. Moreover, the secondary lens 123, which is spherical and thus not easy to be positioned and retained, can be accurately positioned relative to the flexible substrate 121, and at the same time, can be fixed easily and reliably.

Further, as shown in FIG. 6, the resin molded body 125, which is obtained through molding, is a molded body that includes not only the secondary lens 123 but also the power generating element 124. Therefore, the optical system from the secondary concentrating portion 122 to the power generating element 124 can be integrally formed by the resin molded body 125. Accordingly, a stable quality of the optical system can be obtained.

<<Concentrator Photovoltaic Unit>>

Figure 7:
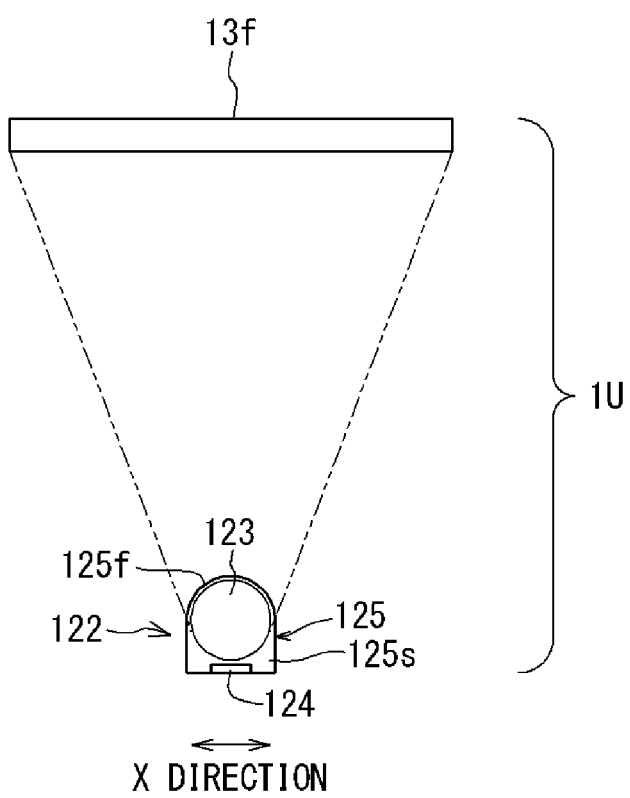
FIG. 7 is a schematic diagram showing a concentrator photovoltaic unit as an optical system base unit forming the above module.

FIG. 7 is a schematic diagram showing a concentrator photovoltaic unit (hereinafter, also simply referred to as "unit") 1U as an optical system base unit forming the above module 1M. That is, in the unit 1U, sunlight concentrated by the Fresnel lens 13*f* (primary lens) as the primary concentrating portion is guided to the power generating element 124 by means of the secondary concentrating portion 122. The secondary concentrating portion 122 includes the secondary lens 123 and the resin molded body 125, and the resin molded body 125 includes the cover portion 125*f* and the support portion 125*s* described above (FIG. 5, FIG. 6). The optical axis of the primary concentrating portion (the Fresnel lens 130 and the optical axis of the secondary concentrating portion 122 should be aligned with each other. However, due to tracking deviation or an error in the mounting position, there are cases where slight displacement occurs in the X direction, for example.

Figure 8:
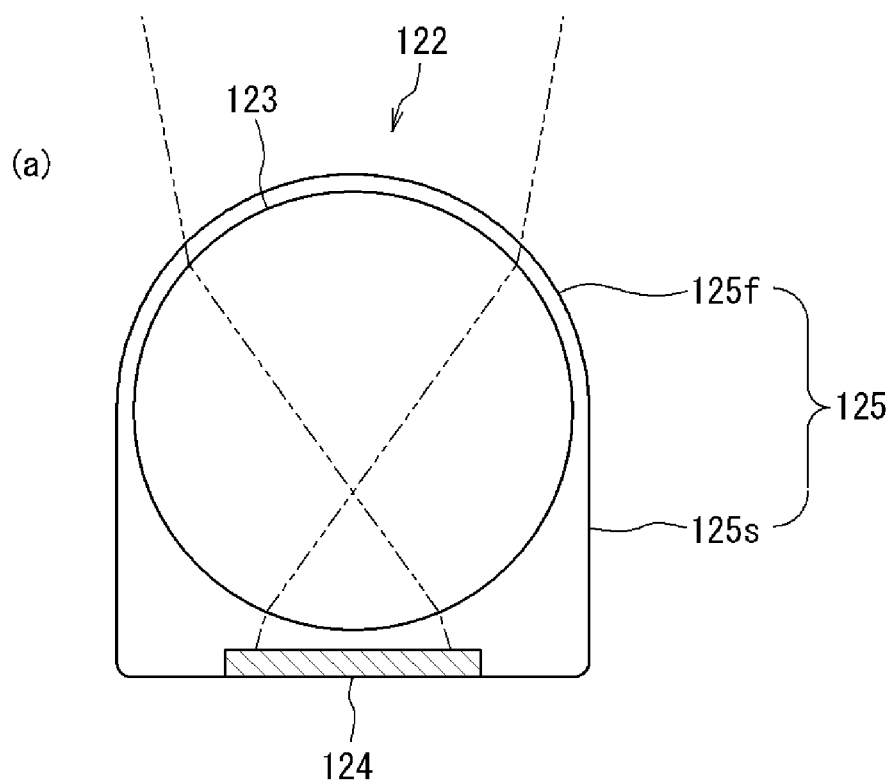
FIG. 8 shows refraction of light caused by a secondary lens.
Figure 8:
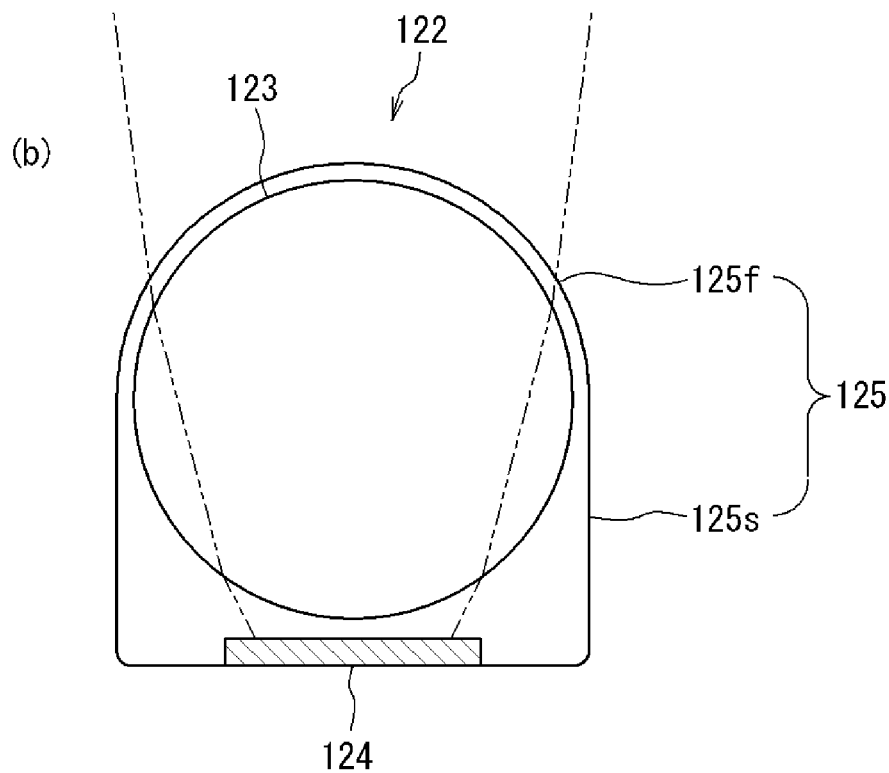

FIG. 8 shows refraction of light caused by the secondary lens 123. (a) shows refraction, of light included in sunlight, light having a short wavelength (for example, ultraviolet light: wavelength of 300 nm), and (b) shows refraction of light having a long wavelength (for example, infrared light: wavelength of 2000 nm). Due to the presence of the secondary lens 123, even when the optical axis of incident light is slightly displaced, light can be guided to the power generating element 124.

That is, separately from the primary lens, by providing the secondary lens 123 near the power generating element 124, light energy is concentrated to a small area, and at the same time, influence of displacement of the optical axis of the secondary concentrating portion 122 relative to the Fresnel lens 13*f* being the primary concentrating portion is reduced, whereby concentrating accuracy can be increased.

<<Effect of Cover Portion>>

Next, the inventors examined what difference occurs in optical effect, between a case where the secondary lens 123 is provided with the cover portion 125*f* by means of the resin molded body 125, and a case where the secondary lens 123 alone is provided.

Figure 9:
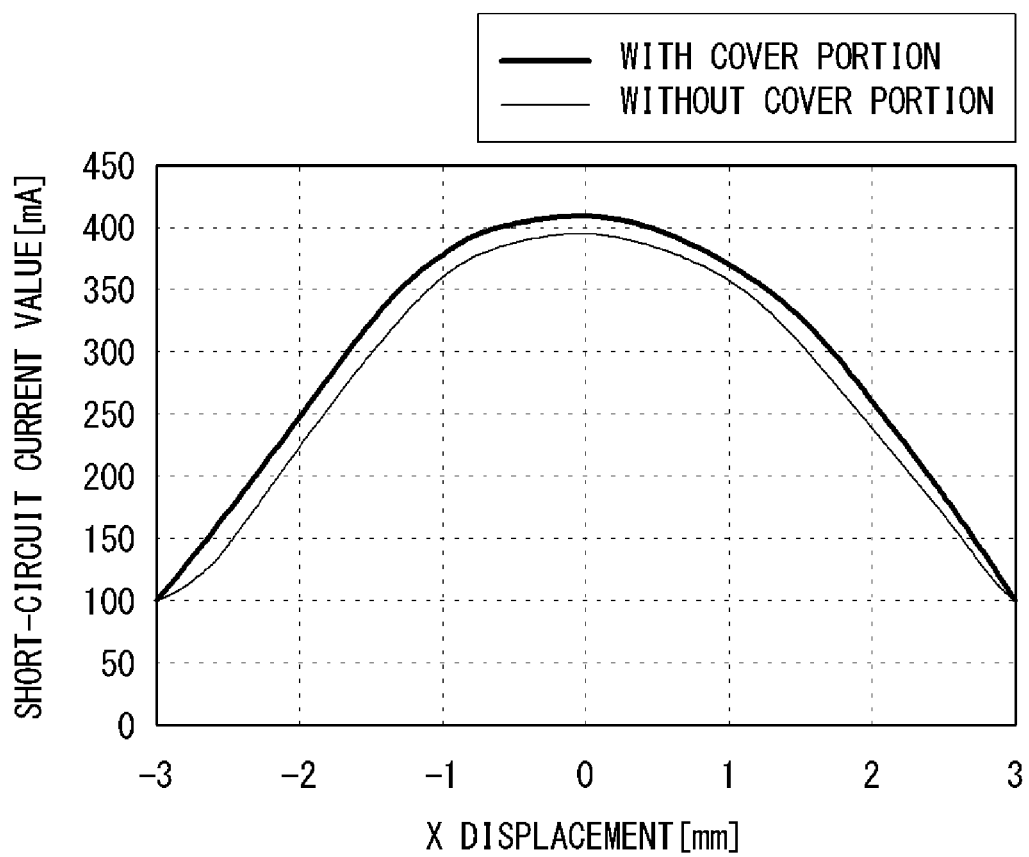
FIG. 9 is a graph of experimental data showing the relationship between X displacement [mm] and short-circuit current value [mA].

FIG. 9 is a graph of experimental data showing the relationship between X displacement [mm] and short-circuit current value [mA]. X displacement is displacement of the optical axis (corresponds to displacement in the X direction in FIG. 7) between the primary concentrating portion and the secondary concentrating portion. Short-circuit current value [mA] is the value of current that flows when light is applied with the output of the power generating element 124 shorted. This short-circuit current value is the value of current when voltage is maintained at 0 without load, and thus, is proportional to the number of electrons being photo-excited by incident light. The number of photo-excited electrons is simply dependent on the amount of photons incident on the power generating element 124. In the graph, the thick line represents data with the cover portion 125*f* and the thin line represents data without the cover portion. The short-circuit current value at X=0 increased from 395 mA to 405 mA as a result of provision of the cover portion, which is about 2.5% improvement.

Figure 10:
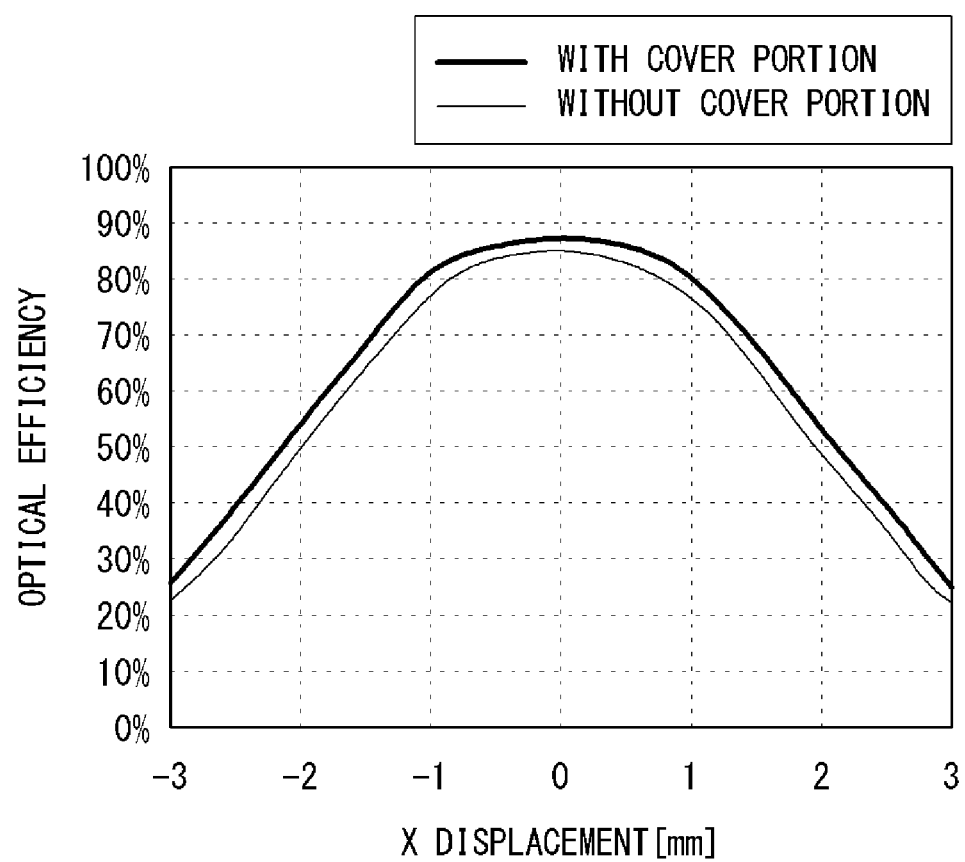
FIG. 10 is a graph of simulation results showing the relationship between X displacement [mm] and optical efficiency [%].

FIG. 10 is a graph of simulation results showing the relationship between X displacement [mm] and optical efficiency [%]. Optical efficiency is the rate of light that enters the power generating element 124 when light incident on the secondary concentrating portion is 100%. In the graph, the thick line represents data with the cover portion 125*f*, and the thin line represents data without the cover portion.

The characteristics of the graph of FIG. 9 and the characteristics of the graph of FIG. 10 match each other very well. With regard to the case with the cover portion and the case without the cover portion, in the range of X: −3 mm to 3 mm, the case "with the cover portion" always shows optically better result. Specifically, it has been found that provision of the cover portion 125*f* improves optical efficiency by about 2 to 3%. This is understood as the cover portion 125*f* exhibiting a function of AR (Anti-Reflection) coating which suppresses reflection of light to be incident on the secondary lens 123. Therefore, reflection of light is suppressed, and the amount of light incident on the secondary lens 123 and the amount of light to be guided to the power generating element 124 are increased.

That is, it can be said that, by providing the cover portion 125f having a refractive index between that of air and that of the secondary lens 123, thereby suppressing reflection of light, transmittance of the secondary lens 123 has been improved by about 2 to 3%. Accordingly, power generation efficiency of the concentrator photovoltaic unit 1U can be improved. Moreover, since the cover portion 125f has a thin film shape, absorption (loss) of light by the cover portion itself can also be suppressed. Further, influence of refraction by the cover portion 125f can also be ignored.

It is generally known that coating is provided on the surface of a lens to prevent reflection of light. Examples include a lens of a light receiving element for communication and a camera lens. In the case of a lens of a light receiving element for communication, the wavelength is limited to a narrow wavelength band of infrared, and thus, designing for reflection prevention is easy. In the case of a camera lens, an expensive multilayer film is used that corresponds to a wavelength region included in visible light.

In contrast, in the case of the secondary concentrating portion of the concentrator photovoltaic unit, light in a wavelength region of 300 nm to 2000 nm from ultraviolet light to infrared light, which is further wider than in the case of the camera lens, is utilized. Thus, a multilayer film cannot be employed in terms of costs.

Therefore, it is very meaningful that transmittance has been improved as much as 2 to 3% by use of the cover portion 125f made of inexpensive resin, merely having a predetermined refractive index, and being a part of the resin molded body 125.

<<Variation of Secondary Lens>>

Figure 11:
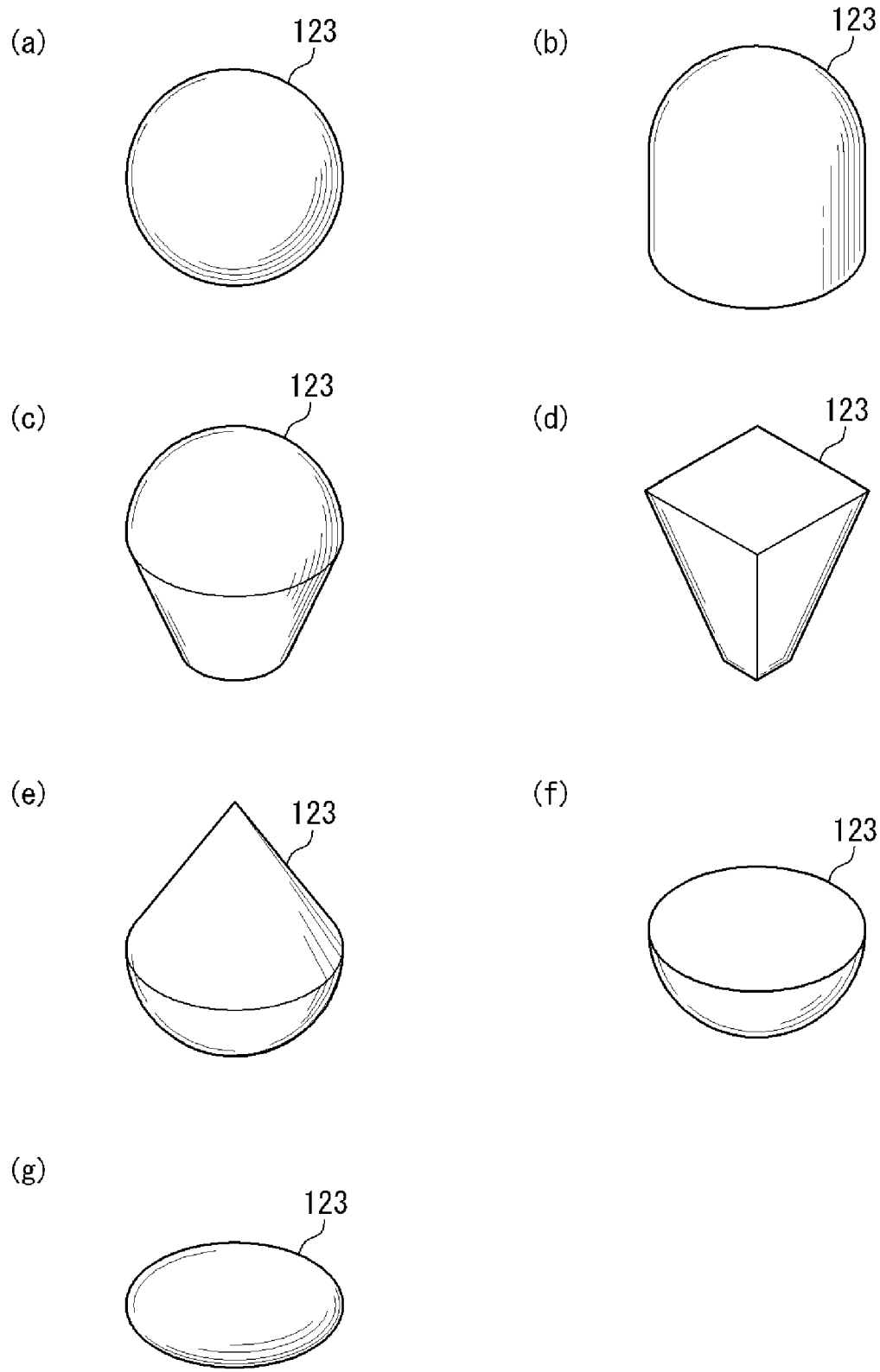
FIG. 11 shows a variation of the secondary lens.

FIG. 11 shows a variation of the secondary lens 123.

As the shape of the secondary lens, any of the following shapes can be employed, alternatively to the spherical shape of (a) already shown.

(b) Hemisphere plus cylinder type: a hemisphere as the upper part plus a cylinder as the lower part (c) Hemisphere plus inverted circular cone type: a hemisphere as the upper part plus an inverted circular cone as the lower part (d) Homogenizer type: a flat surface (square) as the top face plus a truncated pyramid (truncated quadrangular pyramid) therebelow (e) Drop type: a circular cone as the upper part plus a hemisphere as the lower part (f) Planoconvex type: a circular flat surface as the top face plus a hemisphere therebelow (g) Ellipsoid type: Body of revolution of ellipse Any of the above various shapes has, at least in a part thereof, one or more of a spherical surface, an ellipsoid surface, a circular cone surface, or an inverted truncated pyramid surface. The secondary lens 123 having such a shape acts to guide received light downward, i.e., to the power generating element, while causing the light to be refracted or totally reflected.

The secondary lens having such a shape is advantageous in that, even when the optical axis thereof is slightly displaced from the optical axis of the primary concentrating portion, the amount of light to be guided to the power generating element is not greatly reduced. Further, in the case where any of the above-mentioned types is employed, at least a surface on which sunlight is incident in the surface of the secondary lens 123 is covered with a cover portion similar to the cover portion 125f.

<<Module/Panel/Apparatus>>

When the concentrator photovoltaic module 1M is configured by arranging a plurality of the above-described concentrator photovoltaic units 1U, the amount of light to be guided to the power generating element 124 is increased in the entirety of the module. Thus, power generation efficiency of the concentrator photovoltaic module 1M can be improved.

Further, when the concentrator photovoltaic panel 1 is configured by arranging a plurality of the concentrator photovoltaic modules 1M, the amount of light to be guided to the power generating element 124 is increased in the entirety of the panel. Thus, power generation efficiency of the concentrator photovoltaic panel 1 can be improved.

Still further, the concentrator photovoltaic apparatus 100 including: the concentrator photovoltaic panel 1; and the driving device 200 which drives the concentrator photovoltaic panel 1 so as to perform operation of tracking the movement of the sun while facing the direction of the sun can maintain, always during daytime, a state of the highest power generation efficiency at that time point.

<<Another Configuration Example of Secondary Concentrating Portion and the Like>>

Figure 12:
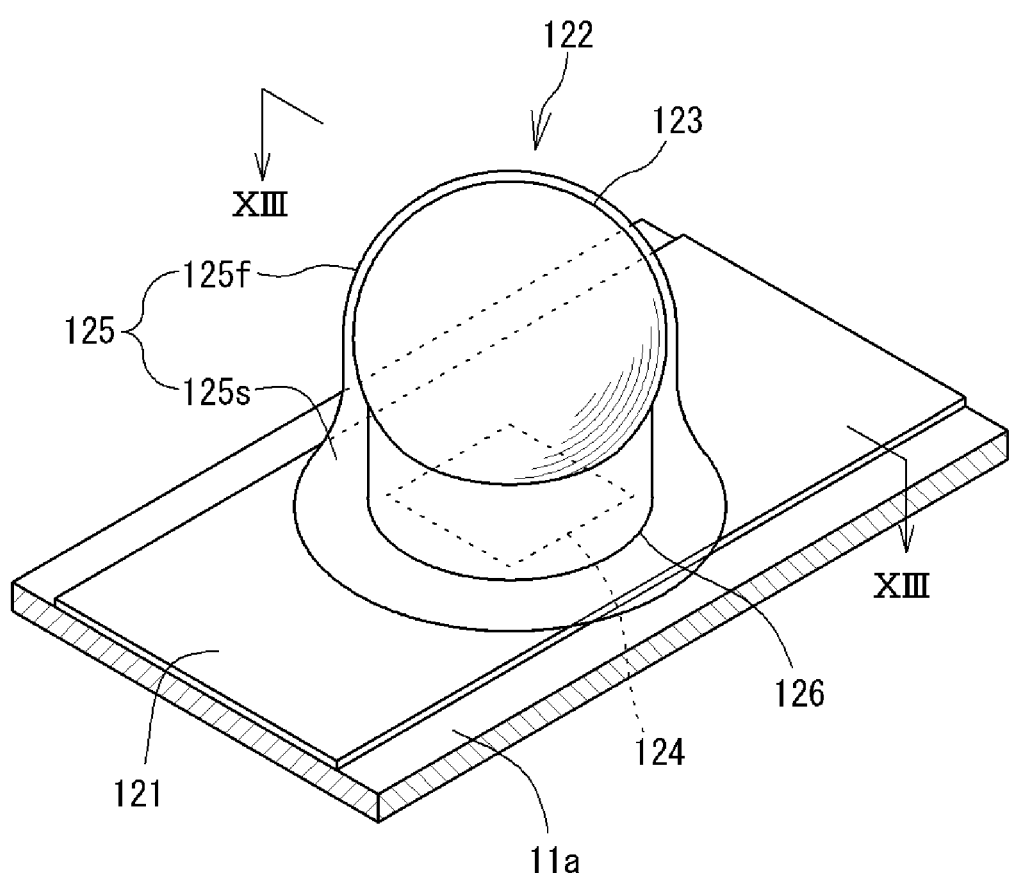
FIG. 12 is a perspective view showing another configuration example of the secondary concentrating portion and the vicinity thereof.

FIG. 12 is a perspective view showing another configuration example of the secondary concentrating portion 122 and the vicinity thereof in the concentrator photovoltaic unit 1U. In the drawing, on the bottom surface 11a of the module 1M, the flexible substrate 121 is provided. On the flexible substrate 121, the power generating element 124 is mounted. A package 126 made of resin and having a tubular shape is assembled integrally with the power generating element 124, thereby retaining the power generating element 124. The power generating element 124 is soldered on the flexible substrate 121, whereby the package 126 is also fixed. On the upper end of the package 126, the secondary lens 123 is placed. The resin molded body 125 forms the cover portion 125f, and at the same time, forms the support portion 125s. The resin molded body 125 including the cover portion 125f continuously covers the surface of the secondary lens 123, the package 126, and an annular area, of the flexible substrate 121, that surrounds the entire outer circumference of the package 126, and extends further onto a little portion of the bottom surface 11a.

Figure 13:
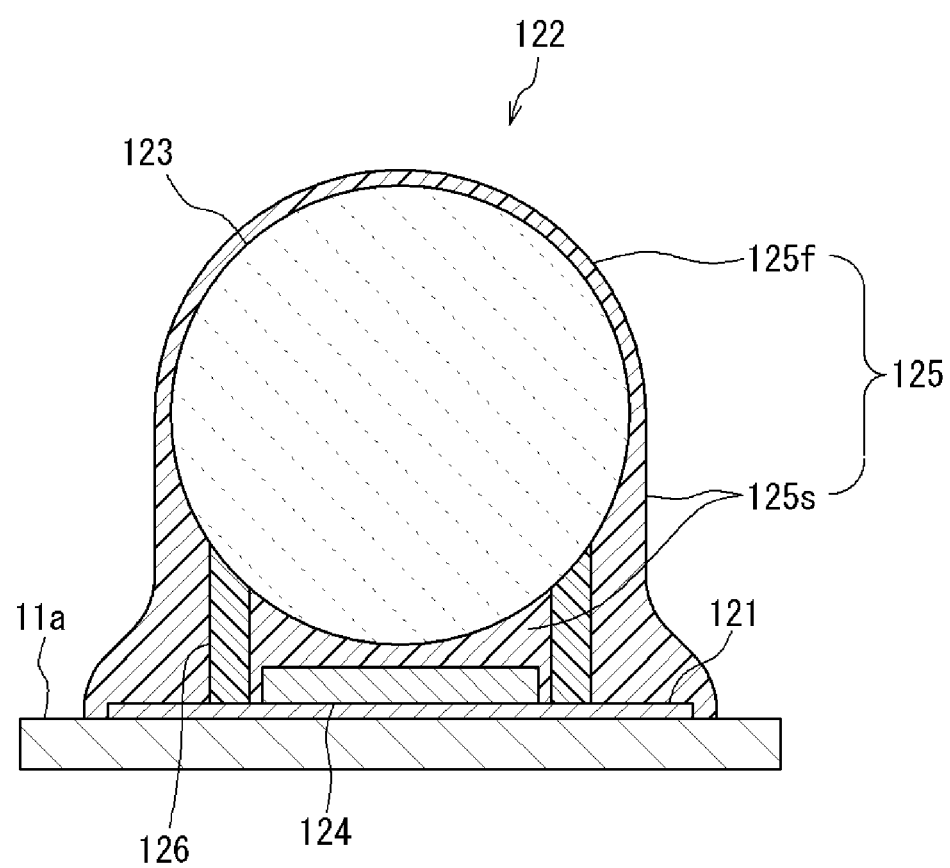
FIG. 13 is a cross-sectional view of FIG. 12, viewed from the XIII-XIII line.

FIG. 13 is a cross-sectional view of FIG. 12, viewed from the XIII-XIII line. As shown, the support portion 125s of the resin molded body 125 is also present inside the package 126. In this manner, portions being in contact with the resin molded body 125 are fixed to each other. Accordingly, integration is enhanced in each of between the secondary lens 123 and the package 126, between the package 126 and the flexible substrate 121, and between the flexible substrate 121 and the bottom surface 11a, and mutual bonding strength can be increased.

The resin molded body 125 has an insulating property, and the site where the secondary lens 123 and the package 126 are in contact with each other, and the site where the package 126 and the flexible substrate 121 are in contact with each other are covered with the resin molded body 125, in all azimuths (360 degrees) without any gap.

In this case, the power generating element 124 is insulated by the resin molded body 125, and withstanding voltage performance of the conducting portion of the power generating element 124 is enhanced. Moreover, even in a high temperature and high humidity environment, moisture does not enter the conducting portion, and thus, the concentrator photovoltaic unit 1U which is highly reliable can be realized.

The resin molded body 125 is made of a translucent resin in the entirety thereof, and as described above, silicone resin or acrylic resin is preferable, for example.

In this case, a part of the resin molded body 125 serves as the cover portion 125*f* that is translucent, and the resin molded body 125 also serves as a fixing member which mutually fixes portions, such as the secondary lens 123 and the like, that are in contact with the resin molded body 125. Therefore, covering of the secondary lens 123 and fixation of the vicinity thereof can be provided at the same time, and thus, the production process can be shortened.

OTHERS

It should be understood that the embodiments disclosed herein are merely illustrative and not restrictive in all aspects. The scope of the present invention is defined by the scope of the claims, and is intended to include meaning equivalent to the scope of the claims and all modifications within the scope.

REFERENCE SIGNS LIST

1 concentrator photovoltaic panel
1M concentrator photovoltaic module
1U concentrator photovoltaic unit
3 pedestal
3*a* post
3*b* base
4 tracking sensor
5 pyrheliometer
11*a* bottom surface
11 housing
11*b* flange portion
12 flexible printed circuit
13 primary concentrating portion
13*f* Fresnel lens
14 connector
100 concentrator photovoltaic apparatus
121 flexible substrate (substrate)
122 secondary concentrating portion
123 secondary lens
124 power generating element
125 resin molded body
125*f* cover portion
125*s* support portion
126 package
200 driving device
201*e* stepping motor
201*a* stepping motor
202 drive circuit
300 electric power meter
400 control device

The invention claimed is:

1. A concentrator photovoltaic unit configured to guide sunlight concentrated by a primary concentrating portion to a power generating element by means of a secondary concentrating portion, the secondary concentrating portion comprising:
   a secondary lens having a spherical shape; and
   a resin molded body made by a translucent material, enclosing therein the secondary lens, the resin molded body having:
      a cover portion, having a refractive index higher than that of air and lower than that of the secondary lens to suppress reflection of light to be incident on the secondary lens, the cover portion covering a surface of an upper hemisphere of the secondary lens with a film, thereby producing a dome shape extending along the surface on which the sunlight is incident, wherein a thickness of the cover portion is greater than 0.0005 mm and less than 0.2 mm, and
      a support portion, which is continuously formed extending from the cover portion, entering into a gap between the secondary lens and the power generating element to support the secondary lens only with the support portion itself, wherein
   the secondary lens and the resin molded body form the secondary concentrating portion, wherein the power generating element is disposed within the resin molded body, and
   the secondary lens is only in contact with the resin molded body.

2. The concentrator photovoltaic unit according to claim 1, wherein
   relative to incident light having a wavelength of 300 nm to 2000 nm, a refractive index of the secondary lens is 1.49 to 1.56, and the refractive index of the cover portion is 1.39 to 1.45.

3. A concentrator photovoltaic module formed by arranging a plurality of the concentrator photovoltaic units according to claim 1.

4. A concentrator photovoltaic panel formed by arranging a plurality of the concentrator photovoltaic modules according to claim 3.

5. A concentrator photovoltaic apparatus comprising:
   the concentrator photovoltaic panel according to claim 4; and
   a driving device configured to drive the concentrator photovoltaic panel so as to perform operation of tracking movement of the sun while facing a direction of the sun.

\* \* \* \* \*